United States Patent
Kobayakawa

(10) Patent No.: US 12,191,435 B2
(45) Date of Patent: *Jan. 7, 2025

(54) SEMICONDUCTOR LIGHT-EMITTING DEVICE

(71) Applicant: ROHM CO., LTD., Kyoto (JP)

(72) Inventor: Masahiko Kobayakawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/459,793

(22) Filed: Sep. 1, 2023

(65) Prior Publication Data

US 2023/0420629 A1 Dec. 28, 2023

Related U.S. Application Data

(60) Continuation of application No. 17/369,710, filed on Jul. 7, 2021, now Pat. No. 11,784,295, which is a (Continued)

(30) Foreign Application Priority Data

Mar. 30, 2007 (JP) .................................. 2007-092879

(51) Int. Cl.
*H01L 33/48* (2010.01)
*H01L 23/495* (2006.01)
(Continued)

(52) U.S. Cl.
CPC ........ *H01L 33/62* (2013.01); *H01L 23/49541* (2013.01); *H01L 33/486* (2013.01);
(Continued)

(58) Field of Classification Search
CPC . H01L 33/62; H01L 23/49541; H01L 33/486; H01L 33/52; H01L 33/54;
(Continued)

(56) References Cited

U.S. PATENT DOCUMENTS 5,062,115 A 10/1991 Thornton
5,719,663 A 2/1998 Hirai et al.
(Continued)

FOREIGN PATENT DOCUMENTS

CN 1288261 A 3/2001
CN 1822402 A 8/2006
(Continued)

OTHER PUBLICATIONS

Office Action issued in the corresponding Japanese Patent application, Mar. 30, 2021, and corresponding English translation.
(Continued)

*Primary Examiner* — Eugene Lee
(74) *Attorney, Agent, or Firm* — HSML P.C.

(57) ABSTRACT

A semiconductor light-emitting device includes a lead frame, a semiconductor light-emitting element mounted on the top surface of the bonding region, and a case covering part of the lead frame. The bottom surface of the bonding region is exposed to the outside of the case. The lead frame includes a thin extension extending from the bonding region and having a top surface which is flush with the top surface of the bonding region. The thin extension has a bottom surface which is offset from the bottom surface of the bonding region toward the top surface of the bonding region.

9 Claims, 3 Drawing Sheets

Related U.S. Application Data continuation of application No. 16/394,376, filed on Apr. 25, 2019, now Pat. No. 11,088,307, which is a continuation of application No. 15/997,184, filed on Jun. 4, 2018, now Pat. No. 10,312,425, which is a continuation of application No. 14/703,273, filed on May 4, 2015, now Pat. No. 10,008,650, which is a continuation of application No. 14/574,640, filed on Dec. 18, 2014, now Pat. No. 9,059,387, which is a continuation of application No. 14/184,173, filed on Feb. 19, 2014, now Pat. No. 8,946,763, which is a continuation of application No. 14/021,501, filed on Sep. 9, 2013, now Pat. No. 8,680,568, which is a continuation of application No. 13/414,294, filed on Mar. 7, 2012, now Pat. No. 8,541,808, which is a continuation of application No. 12/890,964, filed on Sep. 27, 2010, now Pat. No. 8,154,045, which is a division of application No. 12/079,760, filed on Mar. 28, 2008, now Pat. No. 7,825,426.

(51) Int. Cl.
*H01L 33/52* (2010.01)
*H01L 33/54* (2010.01)
*H01L 33/56* (2010.01)
*H01L 33/60* (2010.01)
*H01L 33/62* (2010.01)
*H01L 33/64* (2010.01)

(52) U.S. Cl.
CPC ............ *H01L 33/52* (2013.01); *H01L 33/54* (2013.01); *H01L 33/56* (2013.01); *H01L 33/60* (2013.01); *H01L 33/642* (2013.01); *H01L 33/647* (2013.01); *H01L 2224/48247* (2013.01); *H01L 2224/48465* (2013.01)

(58) Field of Classification Search
CPC ....... H01L 33/56; H01L 33/60; H01L 33/647; H01L 2224/48247
See application file for complete search history.

(56) References Cited

U.S. PATENT DOCUMENTS

| | | | |
|---|---|---|---|
| 5,789,280 A * | 8/1998 | Yokota | H01L 23/49558 257/E23.049 |
| 6,081,029 A | 6/2000 | Yamaguchi | |
| 6,143,981 A | 11/2000 | Glenn | |
| 6,281,568 B1 | 8/2001 | Glenn et al. | |
| 6,501,156 B1 | 12/2002 | Nakanishi et al. | |
| 6,630,728 B2 | 10/2003 | Glenn | |
| 6,661,083 B2 | 12/2003 | Lee et al. | |
| 6,809,409 B2 | 10/2004 | Fukui et al. | |
| 6,825,062 B2 * | 11/2004 | Yee | H01L 24/32 257/E23.047 |
| 6,873,032 B1 | 3/2005 | McCann et al. | |
| 6,967,125 B2 | 11/2005 | Fee et al. | |
| 6,984,878 B2 | 1/2006 | Park et al. | |
| 6,995,510 B2 | 2/2006 | Murakami et al. | |
| 7,042,068 B2 | 5/2006 | Ahn et al. | |
| 7,205,180 B1 | 4/2007 | Sirinorakul et al. | |
| 7,242,076 B2 | 7/2007 | Dolan | |
| 7,359,204 B1 | 4/2008 | Jang et al. | |
| 7,436,002 B2 | 10/2008 | Brunner et al. | |
| 7,655,958 B2 | 2/2010 | Sanmyo | |
| 8,129,222 B2 * | 3/2012 | Tan | H01L 24/49 438/118 |
| 8,680,568 B2 | 3/2014 | Kobayakawa | |
| 8,946,763 B2 | 2/2015 | Kobayakawa | |
| 10,008,650 B2 | 6/2018 | Kobayakawa | |
| 2002/0005573 A1 | 1/2002 | Maeda | |
| 2002/0041011 A1 | 4/2002 | Shibata | |
| 2004/0070056 A1 | 4/2004 | Matsuzawa et al. | |
| 2004/0080026 A1 | 4/2004 | Minamio et al. | |
| 2004/0159850 A1 | 8/2004 | Takenaka | |
| 2005/0051877 A1 | 3/2005 | Hsu | |
| 2005/0093117 A1 | 5/2005 | Masuda et al. | |
| 2005/0151149 A1 | 7/2005 | Chia et al. | |
| 2005/0189626 A1 | 9/2005 | Xiaochun et al. | |
| 2005/0258520 A1 | 11/2005 | Dolan | |
| 2005/0269587 A1 | 12/2005 | Loh et al. | |
| 2005/0280017 A1 | 12/2005 | Oshio et al. | |
| 2006/0027902 A1 | 2/2006 | Ararao et al. | |
| 2006/0170083 A1 | 8/2006 | Kim et al. | |
| 2006/0223238 A1 | 10/2006 | Koh et al. | |
| 2006/0255438 A1 | 11/2006 | Omori et al. | |
| 2007/0170570 A1 | 7/2007 | Camacho et al. | |
| 2007/0176271 A1 | 8/2007 | Trasporto et al. | |
| 2008/0121921 A1 | 5/2008 | Loh et al. | |
| 2008/0185693 A1 | 8/2008 | Punzalan et al. | |
| 2012/0080674 A1 | 4/2012 | Shimizu et al. | |
| 2012/0132938 A1 | 5/2012 | Komatsu et al. | |
| 2012/0138967 A1 | 6/2012 | Shimizu et al. | |
| 2014/0117403 A1 | 5/2014 | Hayashi | |
| 2019/0067172 A1 | 2/2019 | Carpenter et al. | |
| 2022/0208701 A1 | 6/2022 | Koduri | |

FOREIGN PATENT DOCUMENTS

| | | |
|---|---|---|
| JP | 63-250163 A | 10/1988 |
| JP | 2000-150765 A | 5/2000 |
| JP | 2000-244022 A | 9/2000 |
| JP | 2003-174200 A | 6/2003 |
| JP | 2004-22862 A | 1/2004 |
| JP | 2004-274027 A | 9/2004 |
| JP | 2004-534405 A | 11/2004 |
| JP | 2005-353914 A | 12/2005 |
| JP | 2006-93470 A | 4/2006 |
| JP | 2006-156704 A | 6/2006 |
| JP | 2006-210909 A | 8/2006 |
| JP | 3125666 U | 9/2006 |
| JP | 2006-313943 A | 11/2006 |
| JP | 2007-5378 A | 1/2007 |
| JP | 2007-42755 A | 2/2007 |
| JP | 2007-59677 A | 3/2007 |
| JP | 2007-67443 A | 3/2007 |
| JP | 2020-120118 A | 8/2020 |
| WO | 2003/005458 A1 | 1/2003 |

OTHER PUBLICATIONS

Office Action received in the corresponding Japanese Patent application, Sep. 12, 2017, (2 pages) and English machine translation.
Office Action received in the corresponding Japanese Patent application, May 10, 2022, and machine translation (12 pages).
Office Action received in the corresponding Japanese Patent application, Oct. 25, 2022, and machine translation (5 pages).

* cited by examiner

SEMICONDUCTOR LIGHT-EMITTING DEVICE

BACKGROUND OF THE INVENTION

1. Field of the Invention

The present invention relates to a semiconductor light-emitting device provided with a semiconductor light-emitting element.

2. Description of the Related Art

FIGS. 6 and 7 illustrate an example of conventional semiconductor light-emitting device (see JP-A-2005-353914, for example). The illustrated semiconductor light-emitting device X includes a lead frame 91, an LED chip 92, a case 93, and a transparent resin 94. The lead frame 91 includes two strip portions, i.e., a relatively long portion 91a and a relatively short portion 91b, as seen from FIG. 6. These two portions, having the same width as seen from FIG. 7, are fitted into a lower space in the case 93 in a manner such that the bottom surface of the lead frame 91 is exposed out of the case 93. The LED chip 92 serves as a light source of the semiconductor light-emitting device X, and is bonded to the longer strip portion 91a of the lead frame 91. The LED chip 92 is connected to the shorter strip portion 91b of the lead frame 91 via a wire 95. The light-emitting device X may be mounted on a printed circuit board, for example.

In order to obtain stronger light emission from the semiconductor light-emitting device X, it is required to apply greater electrical power to the LED chip 92. Inevitably, the amount of heat generated by the LED chip 92 is increased, and for maintaining the proper light emission, the heat should be conducted from the longer strip portion 91a to the circuit board. One way to facilitate the heat conduction is to broaden the strip portion 91a (hence the lead frame 91) to which the LED chip 92 is attached.

While the width of the longer strip portion 91a is to be increased, the overall size of the case 93 may be unchanged so that the light-emitting device X is kept compact. In this case, the side walls of the case 93 need to be made thinner to permit the size increase of the longer strip portion 91a. This configuration, however, will weaken the frame-holding force of the case 93, which may allow the lead frame 91 to drop off from the case 93.

SUMMARY OF THE INVENTION

The present invention has been proposed under above-described circumstances, and thus an object of the present invention is to provide a semiconductor light-emitting device that is compact and capable of emitting bright light.

According to the present invention, there is provided a semiconductor light-emitting device comprising: a lead frame including a bonding region having a top surface and a bottom surface; a semiconductor light-emitting element mounted on the top surface of the bonding region; and a case covering part of the lead frame. The bottom surface of the bonding region is exposed to an outside of the case. The lead frame includes a thin extension extending from the bonding region and having a top surface and a bottom surface. The top surface of the thin extension is flush with the top surface of the bonding region, while the bottom surface of the thin extension is offset from the bottom surface of the bonding region toward the top surface of the bonding region.

Preferably, the semiconductor light-emitting device of the present invention may further comprise a thick extension extending from the bonding region and having a top surface and a bottom surface. The thick extension is arranged adjacent to the thin extension and is the same in thickness as the bonding region. The bottom surface of the thick extension is exposed to the outside of the case.

Other features and advantages will be apparent from the following description with reference to the accompanying drawings.

DETAILED DESCRIPTION OF THE PREFERRED EMBODIMENTS

Preferred embodiments of the present invention will be described below with reference to the accompanying drawings.

Figure 1:
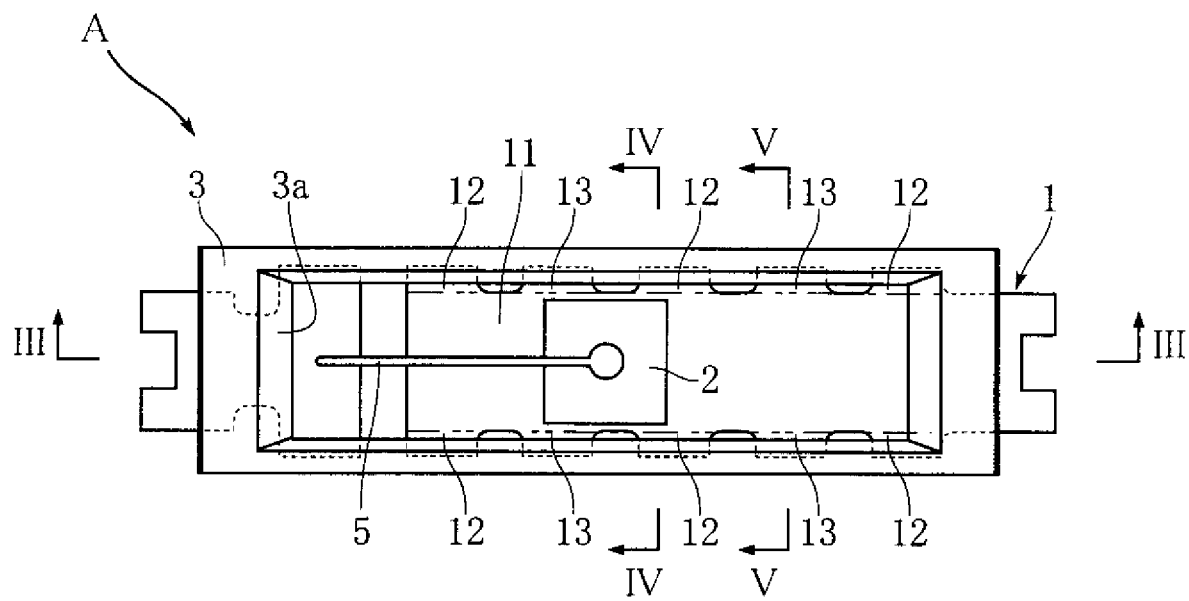
FIG. 1 is a plan view illustrating the principal portions of a semiconductor light-emitting device according to the present invention.

FIGS. 1-5 illustrate a semiconductor light-emitting device according to the present invention. The semiconductor light-emitting device A includes a lead frame 1, a light-emitting diode (LED) chip 2, a case 3, and a protection resin 4 that allows the passage of light emitted from the LED chip 2. The light-emitting device A is a small rectangular parallelepiped having a length of about 4 mm, a width of about 1 mm, and a height of about 0.6 mm. In FIG. 1, for convenience of explanation, the protection resin 4 is not shown.

Figure 2:
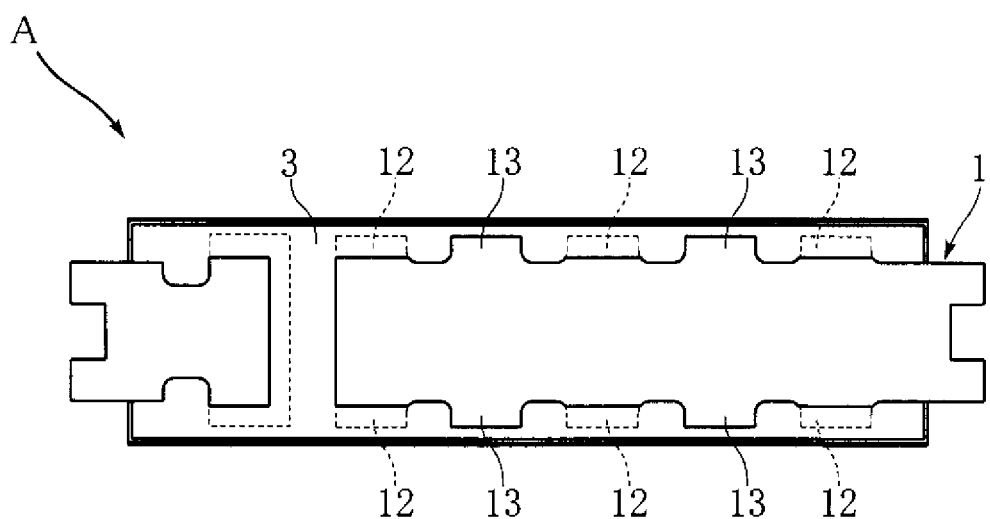
FIG. 2 is a bottom view illustrating the semiconductor light-emitting device shown in FIG. 1.

The lead frame 1 is made of Cu, Ni, or an alloy containing Cu and/or Ni. As shown in FIG. 2, the lead frame 1 is exposed out of the case 3 at its bottom surface, and is divided into a longer primary portion and a shorter secondary portion. The primary portion includes a bonding region 11, a plurality of thin extensions 12, and a plurality of thick extensions 13. In FIG. 1, the boundary between the bonding region 11 and the extensions 12, 13 is indicated by double-dot broken lines.

Figure 4:
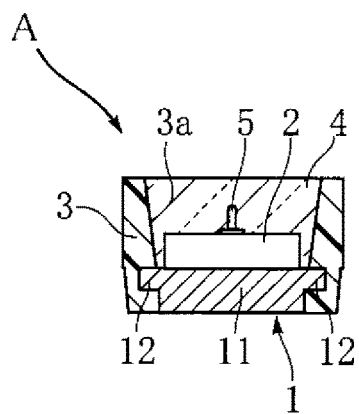
FIG. 4 is a sectional view taken along lines IV-IV in FIG. 1.

The bonding region 11 is a strip-shaped region on part of which the LED chip 2 is mounted. Each of the thin extensions 12 extends out from the bonding region 11, and has a thickness which is about half the thickness of the bonding region 11, for example. As shown in FIG. 4, the top surfaces of the thin extensions 12 are flush with the top surface of the bonding region 11. The bottom surfaces of the thin extensions 12 are positioned higher than the bottom surface of the bonding portion 11, as viewed vertically in FIG. 4 (in other words, the bottom surfaces of the thin extensions 12 are offset toward the top surface of the bonding region 11 from the bottom surface of the bonding region 11). The bottom surfaces of the thin extensions 12 are covered by the case 3.

Figure 5:
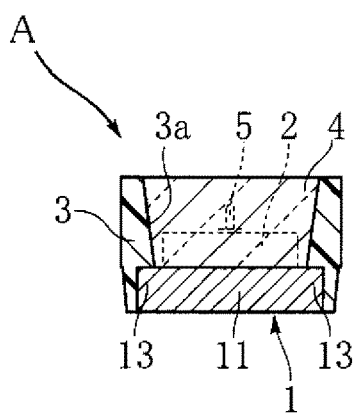
FIG. 5 is a sectional view taken along lines V-V in FIG. 1.
Figure 6:
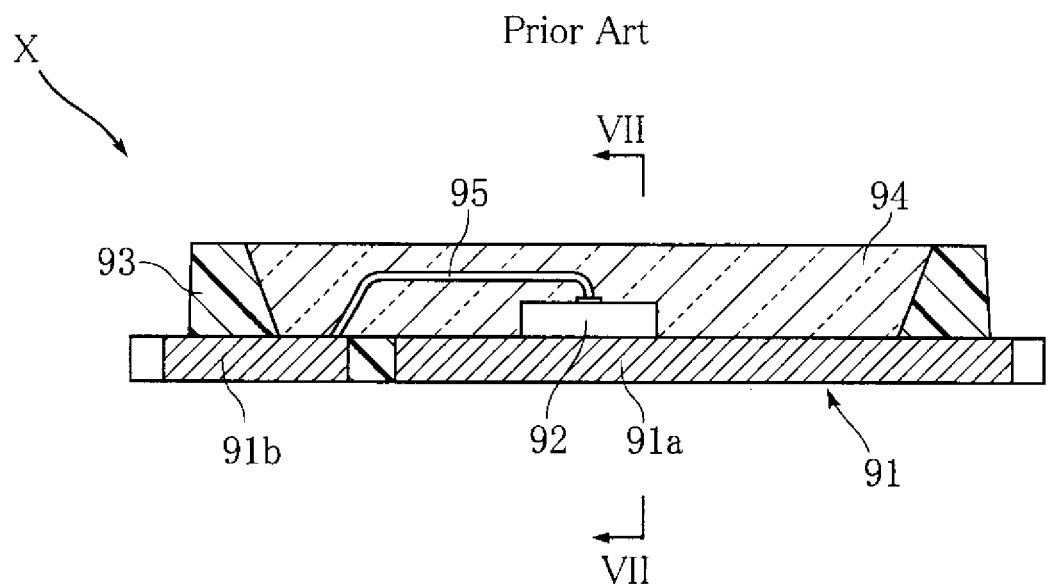
FIG. 6 is a sectional view illustrating a conventional semiconductor light-emitting device.
Figure 7:
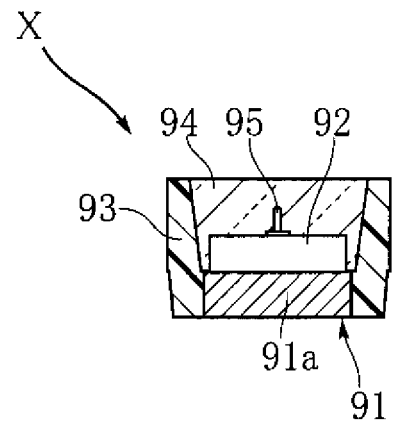
FIG. 7 is a sectional view taken along lines VII-VII in FIG. 6.

As shown in FIG. 5, each of the thick extensions 13 extends out from the bonding region 11, and has a thickness which is substantially the same as the thickness of the bonding region 11. The top surfaces of the thick extensions 13 are flush with the top surface of the bonding region 11, and the bottom surfaces of the thick extensions 13 (which are flush with the bottom surface of the bonding region 11) are exposed to the outside of the case 3. As shown in FIGS. 1 and 2, the thin extensions 12 and the thick extensions 13 are arranged alternatively in the longitudinal direction of the lead frame 1.

The LED chip 2 as a light source of the light-emitting device A is configured to emit light of a predetermined wavelength. The LED chip 2 is made of a semiconductor material such as GaN, for example, and emits blue light, green light, or red light by the recombination of electrons and holes at an active layer sandwiched by an n-type semiconductor layer and a p-type semiconductor layer. The LED chip 2 is connected to the shorter portion of the lead frame 1 via a wire 5.

Figure 3:
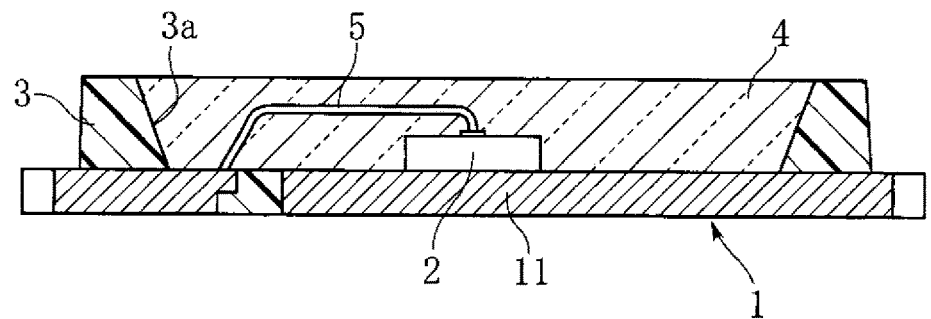
FIG. 3 is a sectional view taken along lines III-III in FIG. 1.

The case 3 is made of a white resin, for example, and is a generally rectangular frame. As shown in FIGS. 3-5, the inner surfaces of the case 3 serve as a reflector 3a that tapers downward. The reflector 3a upwardly reflects light which is emitted laterally from the LED chip 2. As shown in FIG. 4, the case 3 is held in unreleasable engagement with the thin extensions 12. Further, as shown in FIG. 2, the case 3 is in mesh with the thin extensions 12 and the thick extensions 13.

The protection resin 4 is made of a transparent or transparent epoxy resin, for example, filled in a space defined by the case 3. The protection resin 4 covers the LED chip 2, and while protecting the LED chip 2.

Next, the functions of the semiconductor light device A will be described below.

As described above, the case 3 is held in unreleasable engagement with the thin extensions 12. Thus, the lead frame 1 is reliably held by the case 3, to be prevented from dropping off from the case 3. As a result, though the light-emitting device A has a very small width (about 1 mm), the lead frame 1 is exposed out of the case 3 in a relatively large area, as seen from FIG. 2. Therefore, heat can be efficiently conducted from the LED chip 2 to a printed circuit board, for example, which contributes to attaining light emission of desired intensity.

As described above, the thin extensions 12 and the thick extensions 13 are arranged to alternate with each other, and the bottom surfaces of the thick extensions 13 are exposed to the outside of the case 3, as shown in FIG. 2. In this manner, the exposed area of the lead frame 1 can be increased. Advantageously, this facilitates the heat dissipation from the led chip 2.

The invention claimed is:

1. A semiconductor device comprising:
a first portion of a lead frame including a bonding portion;
a second portion of a lead frame spaced apart from the first portion of lead frame in a first direction perpendicular to a thickness direction of the bonding portion;
a semiconductor element mounted on a first surface of the bonding portion and electrically connected to the first portion of lead frame and the second portion of lead frame; and
a case covering a part of the first portion of lead frame and a part of the second portion of lead frame,
wherein the bonding portion includes a first exposed surface that is opposite from the first surface and exposed from the case,
the first portion of lead frame further includes a plurality of thin extensions and a plurality of thick extensions, each thin extension extending from the bonding portion in a second direction perpendicular to the thickness direction and the first direction, each thin extension being smaller in thickness than the bonding portion, and each thick extension extending from the bonding portion in the second direction,
the plurality of thick extensions are disposed next to the plurality of thin extensions and have a same thickness as the bonding portion, each thick extension including a second exposed surface that is exposed from the case,
the second exposed surface of each thick extension and the first exposed surface of the bonding portion are contained in a same flat plane, and
the positions of the plurality of thick extensions are at different locations in the first direction from the positions of the plurality of thin extensions.

2. The semiconductor device according to claim 1, wherein the first portion of lead frame is made of a metal.

3. The semiconductor device according to claim 1, wherein no semiconductor elements are mounted on the first portion of lead frame other than the above-mentioned semiconductor element.

4. The semiconductor device according to claim 1, wherein the plurality of thick extensions and the plurality of thin extensions of the first portion of lead frame are disposed next to and spaced apart from each other in the first direction.

5. The semiconductor device according to claim 1, wherein the plurality of thin extensions and the plurality of thick extensions are disposed alternately in the first direction.

6. The semiconductor device according to claim 5, wherein the plurality of thin extensions comprise three thin extensions, and the plurality of thick extensions comprise two thick extensions,
the three thin extensions and the two thick extensions are disposed alternately in the first direction.

7. A semiconductor device comprising:
a first portion of a lead frame including a bonding portion;
a second portion of a lead frame spaced apart from the first portion of lead frame in a first direction perpendicular to a thickness direction of the bonding portion;
a semiconductor element mounted on a first surface of the bonding portion and electrically connected to the first portion of lead frame and the second portion of lead frame; and
a case covering a part of the first portion of lead frame and a part of the second portion of lead frame,
wherein the bonding portion includes a first exposed surface that is opposite from the first surface and exposed from the case,
the first portion of lead frame further includes a plurality of thin extensions and at least one a plurality of thick extensions, each thin extension extending from the bonding portion in a second direction perpendicular to the thickness direction and the first direction, each thin extension being smaller in thickness than the bonding portion, each thick extension extending from the bonding portion in the second direction,
each thick extension has a same thickness as the bonding portion and includes a second exposed surface that is exposed from the case,
the plurality of thick extensions and the plurality of thin extensions are disposed next to and spaced apart from each other in the first direction, the second exposed surface of each thick extension and the first exposed surface of the bonding portion are contained in a same flat plane, and the positions of the plurality of thick extensions are at different locations in the first direction from the positions of the plurality of thin extensions.

8. The semiconductor device according to claim 7, wherein the plurality of thin extensions and the plurality of thick extensions are disposed alternately in the first direction.

9. The semiconductor device according to claim 8, wherein the plurality of thin extensions comprise three thin extensions, and the plurality of thick extensions comprise two thick extensions, and the three thin extensions and the two thick extensions are disposed alternately in the first direction.

* * * * *